(12) United States Patent
Ketelsen

(10) Patent No.: US 9,450,372 B1
(45) Date of Patent: Sep. 20, 2016

(54) WAVELENGTH TUNABLE SEMICONDUCTOR LASER

(71) Applicant: Avago Technologies General IP (Singapore) Pte. Ltd., Singapore (SG)

(72) Inventor: Leonard Jan-Peter Ketelsen, Clinton, NJ (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/754,891

(22) Filed: Jun. 30, 2015

(51) Int. Cl.
*H01S 3/13* (2006.01)
*H01S 3/137* (2006.01)
*H01S 3/063* (2006.01)
*H01S 5/10* (2006.01)

(52) U.S. Cl.
CPC ............... *H01S 3/137* (2013.01); *H01S 3/063* (2013.01); *H01S 3/1307* (2013.01); *H01S 5/1039* (2013.01)

(58) Field of Classification Search
CPC ...... H01S 3/137; H01S 3/063; H01S 3/1307; H01S 3/139; H01S 3/08063; H01S 3/08027; H01S 3/105; H01S 3/1062; H01S 5/1039; H01S 5/1028; H01S 5/1032; H01S 5/4068; H01S 5/06206
See application file for complete search history.

(56) References Cited

U.S. PATENT DOCUMENTS

| 8,306,375 | B2 | 11/2012 | Kato | |
| 2009/0154505 | A1* | 6/2009 | Oh | G02B 6/12007 372/20 |
| 2012/0189025 | A1 | 7/2012 | Zheng | |
| 2015/0207291 | A1* | 7/2015 | Rickman | H01S 3/083 372/20 |

* cited by examiner

*Primary Examiner* — Armando Rodriguez

(57) ABSTRACT

A tunable semiconductor laser incorporates a light generating structure in which light is generated and amplified by stimulated emission. The generated light is evanescently coupled into a first resonator of a first resonant optical reflector where the light is reflected back and forth between two end mirrors. A portion of this light, which is characterized by a series of resonant wavelengths, is evanescently coupled back into the light generating structure. One or more of the resonant wavelengths can be changed by modifying an optical path length of the first resonator. The tunable semiconductor laser further includes a second resonant optical reflector having a second resonator. The second resonator interacts with the light generating structure in a manner similar to the first resonator. A desired beat wavelength can be obtained by modifying the optical path length in one or both resonators.

20 Claims, 4 Drawing Sheets

WAVELENGTH TUNABLE SEMICONDUCTOR LASER

FIELD OF THE INVENTION

The invention relates to semiconductor lasers, and more particularly, to wavelength tunable semiconductor lasers.

BACKGROUND

Semiconductor lasers play an important role in optical communication systems, particularly in optical communication systems that employ high digital data rates. It is desirable that these semiconductor lasers not only have a small size but also offer various features that make them attractive for use in a number of different applications. One such feature that is desirable in a semiconductor laser is wavelength tunability. Wavelength tunability, which is available in some types of traditional semiconductor lasers, allows a laser to be tuned to a first wavelength for use in a first application and tuned to a different wavelength where needed for use in a different application.

Traditional tunable wavelength lasers can be classified under two broad categories. A laser belonging to the first category is typically referred to in the art as a Distributed Bragg Reflector (DBR) tunable laser and a laser belonging to the second category is typically referred to as an external-cavity tunable laser. Each of these two types of tunable lasers has its strengths and weaknesses but neither one can be used in a universal manner for all applications.

DBR based tunable lasers generally are compact in size and are often used in various direct-detection based communications systems. However, these lasers have two significant shortcomings: 1) fabrication issues, and 2) an undesirable broad spectrum emission characteristic. While fabrication issues can be mitigated to some extent by improvements in fabrication techniques, the broad spectrum emission characteristics of DBR based lasers often prevents their use in coherent communication systems requiring narrow emission linewidths for proper operation.

External-cavity tunable lasers have inherently narrow emission linewidths making them suitable for coherent communication systems as well as some other systems such as direct detection systems. However, these lasers can be quite complex to fabricate as well as to use. For example, it is difficult to maintain long term stability in an external-cavity tunable laser in comparison to a DBR based tunable laser. Furthermore, both DBR tunable lasers and external-cavity tunable lasers suffer from cost structure challenges that limit their broad use in optical communication systems.

It is therefore desirable that such issues in traditional tunable wavelength lasers be addressed.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure and not every similar element is shown in each figure, or replicated in the various figures. The drawings are not necessarily drawn to scale, emphasis instead being placed upon illustrating the principles of the invention. The drawings should not be interpreted as limiting the scope of the invention to the example embodiments shown herein.

WRITTEN DESCRIPTION

Figure 1:
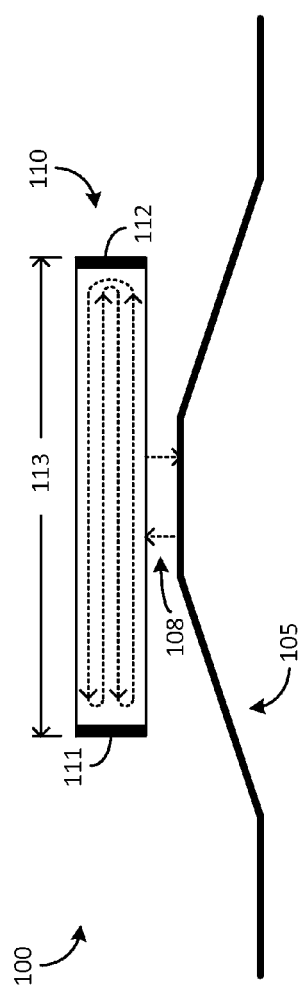
FIG. 1 shows an exemplary Fabry-Perot Resonant Optical Reflector (FP-ROR) that can be incorporated into a wavelength tunable semiconductor laser in accordance with the disclosure.

Throughout this description, embodiments and variations are described for the purpose of illustrating uses and implementations of inventive concepts. The illustrative description should be understood as presenting examples of inventive concepts, rather than as limiting the scope of the concepts as disclosed herein. It should be further understood that certain words and phrases are used herein solely for convenience and such words and phrases should be interpreted as referring to various objects and actions that are generally understood in various forms and equivalencies by persons of ordinary skill in the art. For example, the word "waveguide" as used herein generally applies to an optical waveguide fabricated in a substrate. However, as is known, an optical waveguide can also be implemented in various other ways, such as, for example, by using fiber optic cables and/or other light conducting elements. As another example, though the description herein often refers to a Fabry-Perot Resonant Optical Reflector (FP-ROR), it should be understood that various other resonant optical reflectors can be used in place of an FP-ROR in various applications. These various applications are not solely limited to coherent applications but can include various non-coherent applications as well. Furthermore, it should be understood that the word "example" as used herein is intended to be non-exclusionary and non-limiting in nature. More particularly, the word "exemplary" as used herein indicates one among several examples, and it should be understood that no undue emphasis or preference is being directed to the particular example being described.

In terms of a general overview, a wavelength tunable semiconductor laser in accordance with an exemplary embodiment of the disclosure includes a light generating structure composed of an optical waveguide in which light is generated by stimulated emission of radiation. The generated light is propagated through the optical waveguide and evanescently coupled into a first resonant optical reflector (ROR) where the light is reflected back and forth between two end mirrors. On each passage during the back and forth reflection in the first ROR, a portion of light is evanescently coupled back into the optical waveguide. The light that is evanescently coupled back into the optical waveguide is characterized by a first spectral range of resonant wavelengths formed as a result of the reflectance properties of the first ROR. The resonant wavelengths are formed when a round trip optical path length in the first ROR is equal to an integral number of wavelengths. The resonant wavelengths in the light coupled back into the optical waveguide of the light generating structure from the first ROR can therefore be modified when so desired, by modifying the round trip optical path length in the first ROR.

In addition to the first ROR, the wavelength tunable semiconductor laser can further include a second ROR that interacts with the optical waveguide in a similar manner. The interaction of the second ROR with the optical waveguide results in a second spectral range of resonant wavelengths formed as a result of the reflectance properties of the second ROR.

The wavelength resonance characteristics of light present in the optical waveguide as a result of the interaction of the optical waveguide with the first ROR and the second ROR can be modified not only by modifying the round trip optical path length in the first ROR but by modifying the round trip optical path length in the second ROR as well. Furthermore, the optical waveguide can include one or both of an optical gain element and an optical phase adjusting element. These elements can also be adjusted so as to modify an overall round trip optical path length in the optical waveguide in addition to, or in lieu of, carrying out round trip optical path length adjustments in one or both of the first ROR and the second ROR.

The process of modifying the optical path lengths, which is generally referred to herein as "tuning," can be carried out so as to obtain a resonant beat wavelength of light from amongst the various wavelengths present in the first and the second spectral range of resonant wavelengths. Light at this resonant beat wavelength can be used in various optical applications.

Attention is now drawn to FIG. 1, which shows an exemplary FP-ROR 100 that can be incorporated into a wavelength tunable semiconductor laser in accordance with the disclosure. FP-ROR 100, which includes an optical waveguide 105 and a resonator 110, can be fabricated on a single substrate contained in a monolithic package or can be fabricated on two or more different substrates contained in a hybrid package. Light propagating through the optical waveguide 105 is evanescently coupled into the resonator 110 where the light is reflected back and forth between a first mirror 111 and a second mirror 112 (as indicated by the dashed lines inside the resonator 110) before being evanescently coupled back into the optical waveguide 105 (as indicated by the dashed lines 108). The light propagating through the optical waveguide 105 takes on the shape of a comb spectrum of discrete resonant wavelengths, which may be alternatively referred to in this disclosure as a spectral range.

One or more of the discrete resonant wavelengths of the comb spectrum can be used for a variety of narrow linewidth applications such as, for example direct detection applications and coherent detection applications. The inter-wavelength spacing between the discrete resonant wavelengths can be set to a desired value by suitably tailoring the physical dimensions of the resonator 110. For example, a physical length 113 of the resonator 110 can be set to correspond to an integral multiple of any one of several resonant wavelengths that may be desired for any one of various applications, thereby resulting in a comb spectrum that includes the desired resonant wavelength.

Figure 2:
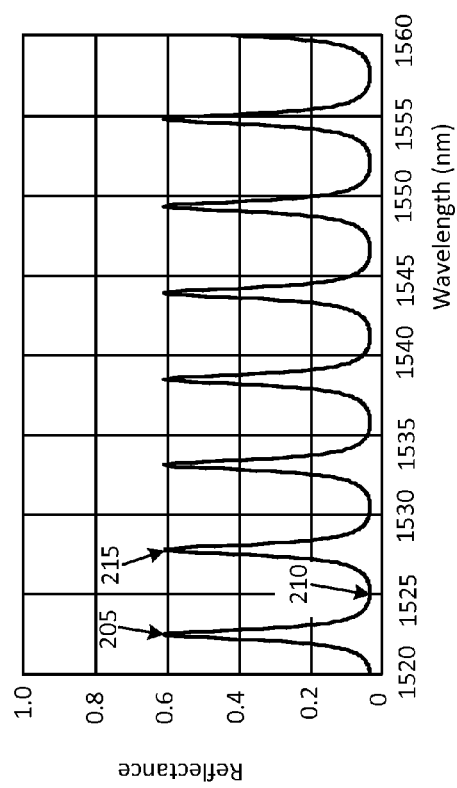
FIG. 2 shows an exemplary spectral range of resonant optical wavelengths associated with the FP-ROR shown in FIG. 1.

FIG. 2 shows an exemplary spectral range of resonant optical wavelengths associated with the FP-ROR 100. In the exemplary graphic shown in FIG. 2, a first resonant wavelength peak 205 is formed at a wavelength of around 1523 nm. The first resonant wavelength peak 205 is followed by a first wavelength trough 210 at a wavelength of around 1525 nm and a second resonant wavelength peak 215 at a wavelength of around 1527 nm. Other resonant wavelength peaks and troughs are formed generally in accordance with the resonance characteristics provided by the FP-ROR 100.

Figure 3:
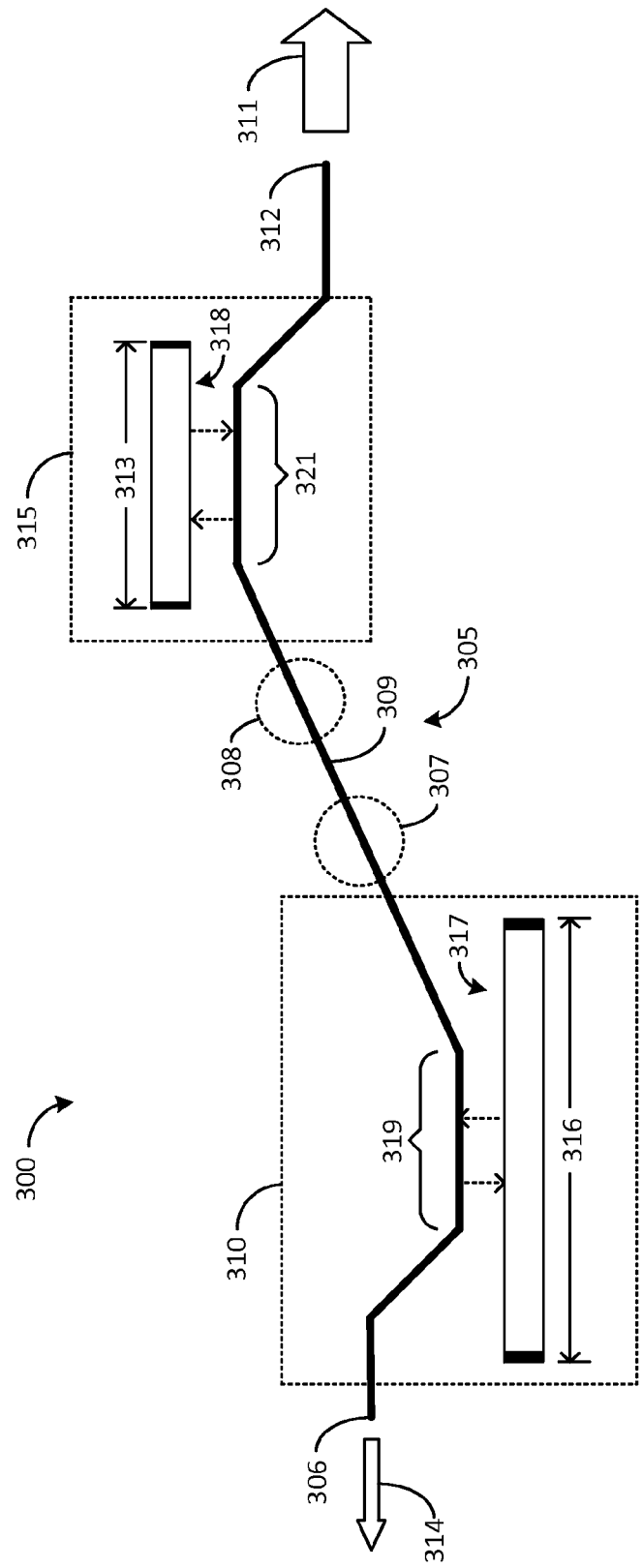
FIG. 3 shows an exemplary embodiment of a wavelength tunable semiconductor laser incorporating two FP-RORs in accordance with the disclosure.

Attention is now drawn to FIG. 3, which shows an exemplary embodiment of a wavelength tunable semiconductor laser 300 incorporating two FP-RORs in accordance with the disclosure. Wavelength tunable semiconductor laser 300, which includes a first FP-ROR 310, a second FP-ROR 315, and a light generating structure 305, can be fabricated on a single substrate contained in a monolithic package or on two or more different substrates contained in a hybrid package, and used for a variety of narrow linewidth applications. Each of the first FP-ROR 310 and the second FP-ROR 315 can be similar to the FP-ROR 100 described above with respect to FIG. 1. The light generating structure 305 of the wavelength tunable semiconductor laser 300 includes an optical waveguide 309, an optical gain element 307, and an optical phase adjusting element 308.

The first FP-ROR 310 is located near one end 306 of the optical waveguide 309 and the second FP-ROR 315 is located near an opposing end 312 of the optical waveguide 309. An intermediate portion of the optical waveguide 309 incorporates the optical gain element 307 and the optical phase adjusting element 308. In this exemplary embodiment, the intermediate portion of the optical waveguide 309 has a sloping orientation and links a substantially horizontal waveguide portion 319 with another substantially horizontal waveguide portion 321 of the optical waveguide 309. In other embodiments, the intermediate portion of the optical waveguide 309 can be provided in various other ways, such as a curved orientation, for example. Furthermore, the sharp transitional corners shown in this example embodiment can be replaced by rounded corners that minimize undesirable optical perturbations.

Laser light generation in the wavelength tunable semiconductor laser 300 is effectuated by coupling the optical resonance provided by each of the two optical resonators (the first FP-ROR 310 and the second FP-ROR 315) with an optical gain introduced between the two optical resonators (via the optical gain element 307). Optical phase of light propagating in the optical waveguide 309 can be modified by using the optical phase adjusting element 308, which can be implemented in various ways.

In a first example implementation, the optical phase adjusting element 308 can be implemented in the form of a forward biased semiconductor element. Changing the forward bias of this semiconductor element changes the refractive index of the semiconductor material from which the forward biased semiconductor element is formed, thereby modifying the phase of an optical signal propagating through the semiconductor material. In a second example implementation, the optical phase adjusting element 308 can be implemented in the form of a heating element that is used for heating a semiconductor material to a suitable temperature. The heating leads to a change in the optical index characteristics of the semiconductor material thereby modifying the phase of an optical signal propagating through the semiconductor material. In a third example implementation, the optical phase adjusting element 308 can be implemented in the form of a mechanical tuning element. The operation of the mechanical tuning element can be based, for example, on changing the dimensions of a portion of the optical waveguide 309. This change leads to a modification of the optical path length characteristics of the optical waveguide 309, which in turn, modifies the phase of an optical signal propagating through the optical waveguide 309.

It should be understood that though the optical phase adjusting element 308 is only shown as a part of the light generating structure 305, a similar phase adjusting element can be incorporated into one or both of the first FP-ROR 310 and the second FP-ROR 315 as well. Furthermore, in some implementations, one or both of the first FP-ROR 310 and the second FP-ROR 315 can consist entirely of one or more passive waveguides, thereby eliminating the need for certain elements such as a carrier injected semiconductor element that may require application of a bias for changing optical index. In the case of passive waveguide ROR structures, phase tuning can be achieved, for example, by local heating of a waveguide or through mechanical means as indicated above.

When the wavelength tunable semiconductor laser 300 is in operation, light that is spontaneously generated and then amplified by stimulated emission in the optical waveguide 309 is evanescently coupled into a resonator 317 of the first FP-ROR 310 via the optical waveguide portion 319 that is aligned substantially parallel to the resonator 317. The resonance characteristics of the resonator 317 can be set in a variety of ways, including by way of example setting a physical length 316 of the resonator 317 to correspond to an integral multiple of a first desired resonant wavelength. A portion of the light that is reflected back and forth in the resonator 317 is evanescently coupled back into the optical waveguide portion 319 of the optical waveguide 309. The portion of light that is evanescently coupled back into the waveguide portion 319 has a first comb spectrum of wavelengths characterized by a first inter-wavelength spacing. The first inter-wavelength spacing can be varied for example, by adjusting the physical length 316 of resonator 317, which changes an optical path length of light propagating inside the resonator 317. In accordance with the disclosure, the optical path length is selected to correspond to an integral multiple of a particular wavelength in the first comb spectrum of wavelengths. This particular wavelength of interest can correspond to a desired wavelength output of the wavelength tunable semiconductor laser 300.

The laser light that is generated by stimulated emission in the optical waveguide 309 is also evanescently coupled into the second FP-ROR 315. The evanescent coupling is carried out via the waveguide portion 321 that is aligned substantially parallel to a resonator 318 that is a part of the second FP-ROR 315. Similar to the resonator 317 of the first FP-ROR 310, the resonator 318 of the second FP-ROR 315 also operates as a resonant chamber in which the evanescently coupled light is reflected back and forth. A portion of the light that is reflected back and forth in the resonator 318 is evanescently coupled back into the waveguide portion 321 of the optical waveguide 309. The portion of light that is evanescently coupled back into the waveguide portion 321 has a second comb spectrum of wavelengths characterized by a second inter-wavelength spacing that is different than the first inter-wavelength spacing which is present in the portion of light evanescently coupled back into the waveguide portion 319 by the resonator 317.

However, the second inter-wavelength spacing can be varied for example, by adjusting a physical length 313 of the resonator 318, which changes an optical path length of light propagating inside the resonator 318. In accordance with the disclosure, the optical path length is selected to correspond to an integral multiple of a particular wavelength in the second comb spectrum of wavelengths. This particular wavelength of interest can correspond to the desired wavelength output of the wavelength tunable semiconductor laser 300.

In addition to setting the first inter-wavelength spacing and the second inter-wavelength spacing to the desired wavelength output of the wavelength tunable semiconductor laser 300, in accordance with a further aspect in accordance with the disclosure, the optical path length of the light generating structure 305 can also be adjusted (for example, by operating the optical phase adjusting element 308) such that the effective optical path length between FP-ROR 310 and FP-ROR 315 is an integral multiple of the desired wavelength output of the wavelength tunable semiconductor laser 300.

The adjustments carried out upon each, or all, of the FP-ROR 310, the FP-ROR 315, and the light generating structure 305 results in light at a resonant beat wavelength being emitted out of the light generating structure 305 in a first direction (which is indicated by an arrow 311) and also in a second opposing direction (which is indicated by an arrow 314). The emission out of the second opposing direction can be made significantly smaller in amplitude than the emission out of the first direction and can be used for optical monitoring purposes. Typically, such optical monitoring is carried out by using a feedback control circuit that measures the optical amplitude of the emission and accordingly adjusts the amplitude of the light emission out of the first direction to a desired level.

Figure 4:
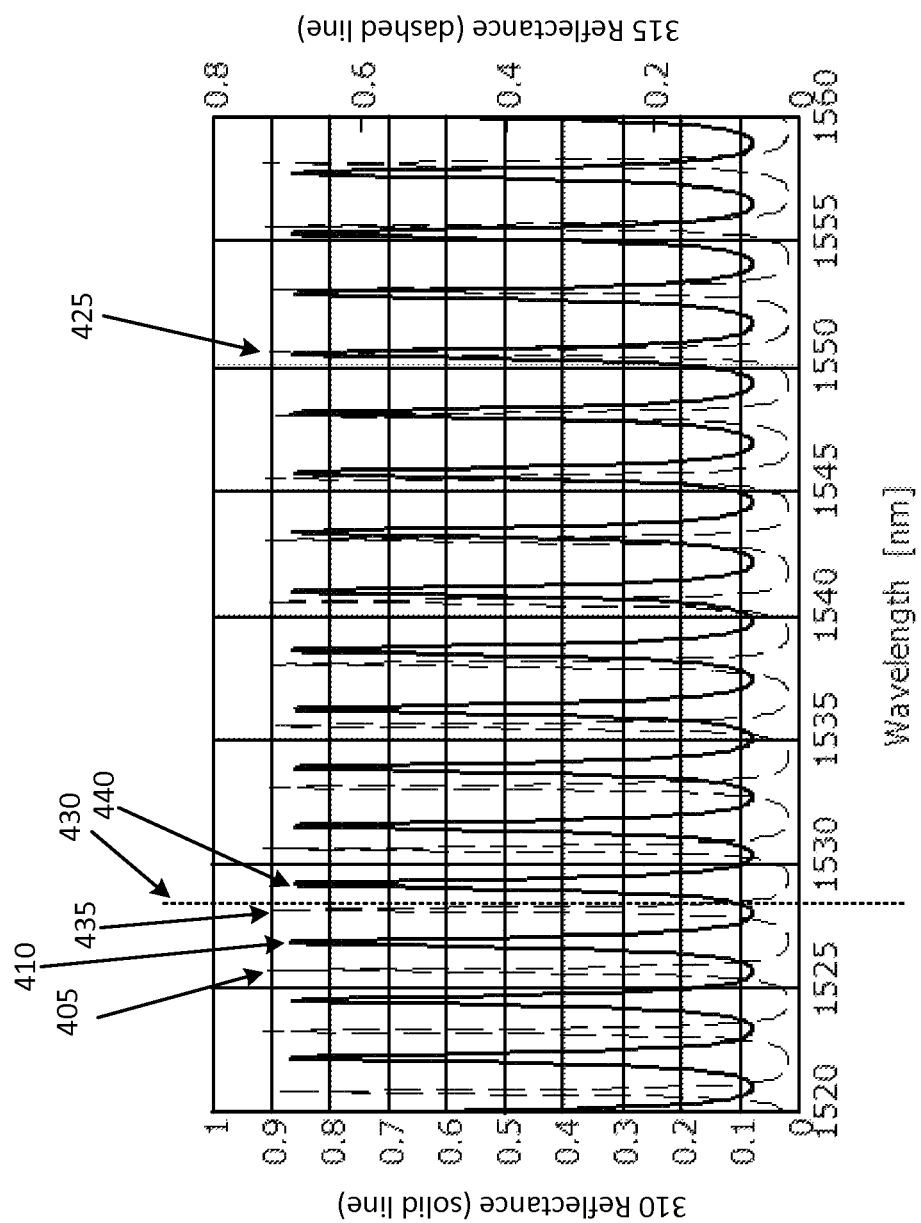
FIG. 4 shows an exemplary graphic wherein a first comb spectrum of wavelengths provided by a first FP-ROR is overlaid upon a second comb spectrum of wavelengths provided by a second FP-ROR, in accordance with the disclosure.

Attention is drawn to FIG. 4, which shows an exemplary first comb spectrum of wavelengths provided by the first FP-ROR 310 overlaid upon an exemplary second comb spectrum of wavelengths provided by the second FP-ROR 315. The first comb spectrum of wavelengths is characterized by a first series of resonant wavelength peaks (shown in solid line format) corresponding to resonant wavelengths formed in the first FP-ROR 310, and the second comb spectrum of wavelengths is characterized by a second series of resonant wavelength peaks (shown in dashed line format) corresponding to resonant wavelengths formed in the second FP-ROR 315. The second series of resonant wavelength peaks is offset with reference to the first series of resonant wavelength peaks at various discrete wavelengths of a wavelength spectrum that ranges from 1520 nm to 1560 nm in this exemplary spectral emission graphic.

The extent of the offset can be modified as desired by intentionally varying, for example, one, or both, of the physical length 316 of the resonator 317 and the physical length 313 of the resonator 318. More particularly, in accordance with the disclosure, the offset is configured to be intentionally variable so as to tune the wavelength tunable semiconductor laser 300 to any one of various desired wavelengths of interest among the various resonant wavelength peaks. Towards this end, one or both of the physical length 316 and the physical length 313 can be variably settable by using a carrier injected semiconductor element, local heating, or a mechanical tuning element (not shown) that is incorporated into one or both of the resonator 317 and the resonator 318.

For example, at one end of the wavelength spectrum, a resonant wavelength peak 405 of the second series of resonant wavelength peaks (associated with the second FP-ROR 315) is offset with respect to a resonant wavelength peak 410 of the first series of resonant wavelength peaks (associated with the first FP-ROR 310). At the other end of the wavelength spectrum, and as indicated by an arrow 425 at a wavelength slightly higher than 1550 nm, a resonant wavelength peak of the second series of resonant wavelength peaks (associated with the second FP-ROR 315) is substantially aligned with a resonant wavelength peak of the first series of resonant wavelength peaks (associated with the first FP-ROR 310). It may be desirable for example that these two resonant wavelength peaks be realigned at precisely 1550 nm, which may be of interest in one of many exemplary coherent detection applications.

The realignment can be carried out by modifying the operating characteristics of one or more of the first FP-ROR 310, the second FP-ROR 315, and the light generating structure 305. The operating characteristics of one or both of the first FP-ROR 310 and the second FP-ROR 315 and particularly, an optical path length in one or both of the first FP-ROR 310 and the second FP-ROR 315 can be modified in various ways, such as, for example, by changing the physical length 316 associated with the resonator 317 or the physical length 313 associated with the resonator 318, or by changing a phase characteristic of the optical path in one or both of the first FP-ROR 310 and the second FP-ROR 315. The operating characteristics of the light generating structure 305, such as, for example an optical path length, can be varied by using the optical phase adjusting element 308.

The rationale behind adjusting the wavelength spacing of the individual wavelength resonances in the exemplary range of resonant wavelengths shown in FIG. 4 is to create a resonant beat wavelength that can be of particular use in an application such as, for example a coherent detection application. Let it be assumed for example that one wishes to create a resonant beat wavelength at 1529 nm (indicated by arrow 430). It can be observed from FIG. 4 that a resonant wavelength peak 435 of the second series of resonant wavelength peaks (associated with the second FP-ROR 315) has a resonant wavelength that is slightly below 1529 nm while a resonant wavelength peak 440 of the first series of resonant wavelength peaks (associated with the first FP-ROR 310) has a resonant wavelength that is slightly above 1529 nm. The resonant beat wavelength can be formed by shifting each of the resonant wavelength peak 435 and the resonant wavelength peak 440 in order to create a precise alignment with 1529 nm. The shifting can be carried out for example by suitably altering the operating characteristics of one or more of the first FP-ROR 310, the second FP-ROR 315, and the light generating structure 305.

An optical path length of the optical waveguide 309 of the light generating structure 305 may also be adjusted in order to suppress a common mode that can exist with respect to the first FP-ROR 310 and the second FP-ROR 315. This common mode typically repeats at a free spectral range related to the physical length 316 and the physical length 313 of the resonator 317 and the resonator 318 respectively. A difference between the physical length 316 and the physical length 313 can be selected such that the free spectral range of the common mode is larger than a tuning range of interest. Unwanted common modes can also be suppressed using other procedures.

Figure 5:
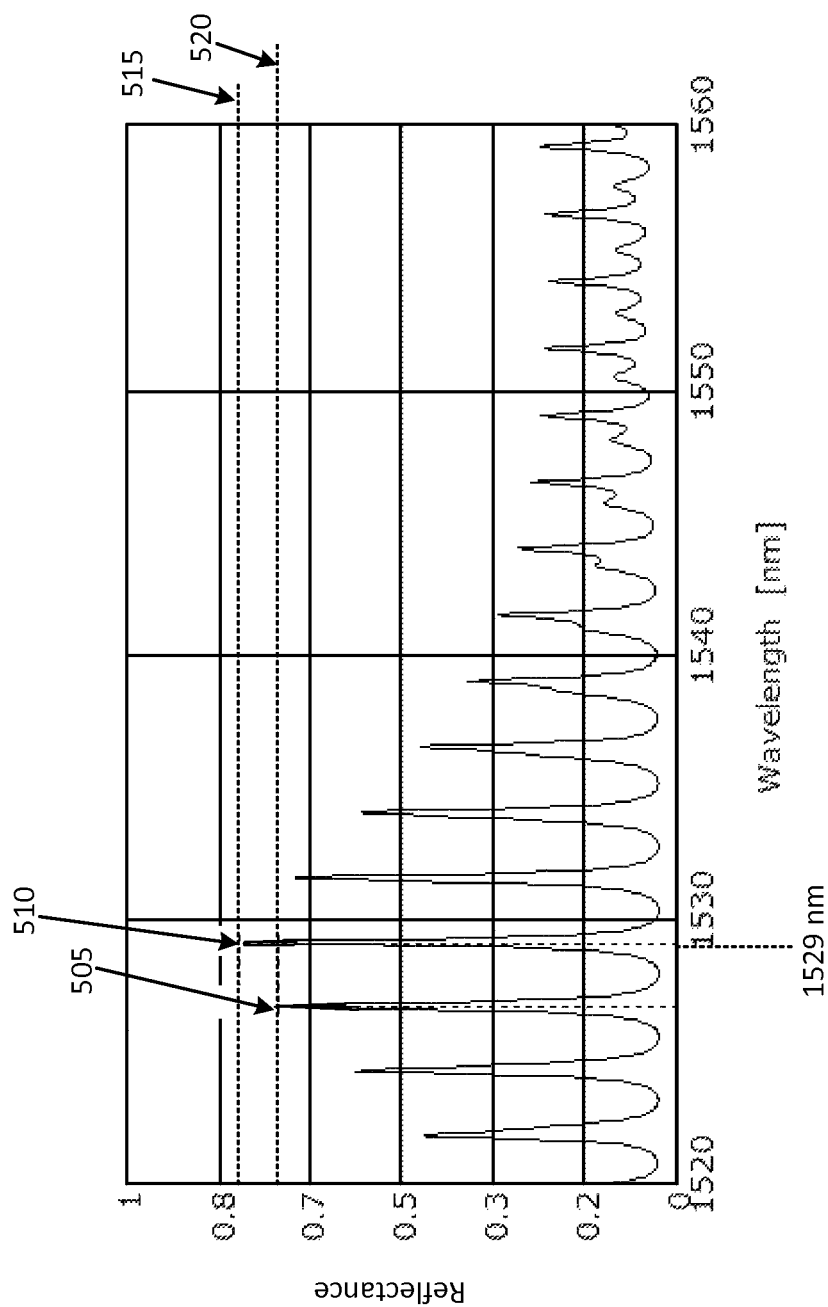
FIG. 5 shows a composite representation of the two comb spectra of wavelengths shown in FIG. 4, after wavelength tuning of a wavelength tunable semiconductor laser in accordance with the disclosure.

FIG. 5 shows a composite representation of the two comb spectra of wavelengths generated by two FP-RORs after wavelength tuning of the wavelength tunable semiconductor laser 300 to an exemplary resonant beat wavelength of 1529 nm. More particularly, the composite representation shown in FIG. 5 reflects a multiplication operation followed by a square root operation upon the first comb spectrum of wavelengths (associated with the first FP-ROR 310) and the second comb spectrum of wavelengths (associated with the second FP-ROR 315) after an optical path length in one or more of the first FP-ROR 310, the second FP-ROR 315, and the light generating structure 305 has been adjusted for generating the resonant beat wavelength of 1529 nm.

As described above with respect to FIG. 4, the resonant beat wavelength 510 at 1529 nm is formed as a result of a constructive additive effect between the resonant wavelength peak 435 of the second series of resonant wavelength peaks (associated with the second FP-ROR 315) and the resonant wavelength peak 440 of the first series of resonant wavelength peaks (associated with the first FP-ROR 310). The resonant beat wavelength at 1529 nm has a significantly higher peak amplitude (indicated by the dashed line 515) than a peak amplitude of a neighboring wavelength 505 (indicated by the dashed line 520). Furthermore, the peak amplitude of the resonant beat wavelength 510 at 1529 nm is significantly greater than that of other resonant wavelength peaks such as the ones located more than 10 nm away on either side of the 1529 nm wavelength. The lower amplitude wavelength peaks are formed as a result of a destructive cancellation effect between various resonant wavelengths of the first and the second series of resonant wavelength peaks.

While FIG. 5 shows one example implementation wherein the wavelength tunable semiconductor laser 300 has been tuned to a resonant beat wavelength at 1529 nm, in other example implementations, the wavelength tunable semiconductor laser 300 can be tuned to various other resonant beat wavelengths depending upon the type of application in which the wavelength tunable semiconductor laser 300 is to be used. Such applications can include for example an optical modulation application where light generated in the wavelength tunable semiconductor laser 300 at a desired resonant beat wavelength is coupled to a modulator for optical modulation purposes.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A semiconductor laser comprising:
   a first tunable resonant optical reflector, the first tunable resonant optical reflector comprising a first resonator having a first pair of mirrors and a first physical length between the first pair of mirrors;
   a second tunable resonant optical reflector, the second tunable resonant optical reflector comprising a second resonator having a second pair of mirrors and a second physical length between the second pair of mirrors; and
   a light generating structure, the light generating structure comprising an optical waveguide, the optical waveguide having a first portion configured to provide evanescent optical coupling with the first tunable resonant optical reflector and a second portion configured to provide evanescent optical coupling with the second tunable resonant optical reflector.

2. The semiconductor laser of claim 1, wherein the optical waveguide further comprises an intermediate portion interconnecting the first portion and the second portion, the intermediate portion including an optical gain element.

3. The semiconductor laser of claim 2, wherein each of the first tunable resonant optical reflector and the second tunable resonant optical reflector consist of passive elements.

4. The semiconductor laser of claim 3, wherein each of the first tunable resonant optical reflector, the second tunable resonant optical reflector, and the optical waveguide is fabricated upon a substrate.

5. The semiconductor laser of claim 1, wherein at least one of the first tunable resonant optical reflector, the second tunable resonant optical reflector, or the light generating structure includes at least one of an optical gain element or a phase adjustment element, the phase adjustment element operable for modifying an optical path length.

6. The semiconductor laser of claim 1, wherein at least one of the first tunable resonant optical reflector, the second tunable resonant optical reflector, or the light generating structure includes a phase adjustment element, and wherein the phase adjustment element comprises at least one of a forward biased semiconductor element, a heating element, or a mechanical tuning element.

7. The semiconductor laser of claim 1, wherein the first physical length of the first resonator is variably settable to correspond to a multiple of a first wavelength and the second physical length of the second resonator is variably settable to correspond to a multiple of a second wavelength that is different than the first wavelength.

8. A semiconductor laser comprising:
a first tunable resonant optical reflector, the first tunable resonant optical reflector comprising a first resonator having a first pair of mirrors and a first physical length between the first pair of mirrors;
a second tunable resonant optical reflector, the second tunable resonant optical reflector comprising a second resonator having a second pair of mirrors and a second physical length between the second pair of mirrors; and
a light generating structure, the light generating structure comprising an optical waveguide, the optical waveguide having a first portion that is aligned substantially parallel to the first optical resonator, a second portion that is aligned substantially parallel to the second resonator, and an intermediate portion linking the first portion to the second portion.

9. The semiconductor laser of claim 8, wherein at least one of the first tunable resonant optical reflector, the second tunable resonant optical reflector, or the light generating structure includes a phase adjustment element operable to enable alignment of a first resonant wavelength in light evanescently coupled into the optical waveguide from the first tunable resonant optical reflector with a second resonant wavelength in light evanescently coupled into the optical waveguide from the second tunable resonant optical reflector.

10. The semiconductor laser of claim 9, wherein the first resonant wavelength is a component of a first plurality of resonant wavelengths having a first inter-wavelength spacing relationship, and the second resonant wavelength is a component of a second plurality of resonant wavelengths having a second inter-wavelength spacing relationship that is different than the first inter-wavelength spacing relationship.

11. The semiconductor laser of claim 10, wherein the first inter-wavelength spacing relationship is defined on the basis of at least one physical dimension of the first tunable resonant optical reflector, and the second inter-wavelength spacing relationship is defined on the basis of at least one physical dimension of the second tunable resonant optical reflector.

12. The semiconductor laser of claim 9, wherein the phase adjustment element comprises at least one of a forward biased semiconductor element, a heating element, or a mechanical tuning element.

13. The semiconductor laser of claim 9, wherein the phase adjustment element is operable to adjust an optical path length in a respective one of the first tunable resonant optical reflector, the second tunable resonant optical reflector, or the light generating structure.

14. The semiconductor laser of claim 8, wherein the intermediate portion of the light generating structure includes an optical gain element.

15. The semiconductor laser of claim 8, wherein each of the first tunable resonant optical reflector and the second tunable resonant optical reflector is a tunable Fabry-Perot Resonant Optical Reflector (FP-ROR).

16. A method of generating coherent light, comprising:
using a first waveguide portion of a light generating structure to provide evanescent optical coupling with a first tunable resonant optical reflector having a first pair of mirrors and a first physical length between the first pair of mirrors;
using a second waveguide portion of the light generating structure to provide evanescent optical coupling with a second tunable resonant optical reflector having a second pair of mirrors and a second physical length between the second pair of mirrors; and
generating a resonant beat wavelength of light by modifying an optical path length in at least one of the first tunable resonant optical reflector, the second tunable resonant optical reflector, or the light generating structure.

17. The method of claim 16, wherein modifying the optical path length comprises wavelength tuning of at least one of a first series of resonant wavelength peaks in light associated with the first tunable resonant optical reflector or a second series of resonant wavelength peaks in light associated with the second tunable resonant optical reflector.

18. The method of claim 16, wherein modifying the optical path length comprises modifying a refractive index of a material in at least one of the first tunable resonant optical reflector, the second tunable resonant optical reflector, or the light generating structure.

19. The method of claim 18, wherein the material is a semiconductor material and wherein modifying the optical path length comprises changing an optical index of the semiconductor material by applying a voltage bias to the semiconductor material.

20. The method of claim 16, wherein modifying the optical path length comprises at least one of: a) using a heating element to heat a material in at least one of the first tunable resonant optical reflector, the second tunable resonant optical reflector, or the light generating structure or b) using a mechanical tuning element to modify a physical dimension of at least one of the first resonator, the second resonator, or the light generating structure.

* * * * *